(12) United States Patent
Park

(10) Patent No.: US 9,754,677 B2
(45) Date of Patent: Sep. 5, 2017

(54) SEMICONDUCTOR MEMORY DEVICE, MEMORY SYSTEM INCLUDING THE SAME, AND OPERATING METHOD THEREOF

(71) Applicant: SK hynix Inc., Gyeonggi-do (KR)

(72) Inventor: Jong Won Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 75 days.

(21) Appl. No.: 14/789,608

(22) Filed: Jul. 1, 2015

(65) Prior Publication Data

US 2016/0224440 A1  Aug. 4, 2016

(30) Foreign Application Priority Data

Feb. 2, 2015  (KR) .......................... 10-2015-0016257

(51) Int. Cl.
*G11C 29/00* (2006.01)
*G11C 16/34* (2006.01)
*G11C 29/44* (2006.01)
*G11C 29/52* (2006.01)

(52) U.S. Cl.
CPC .......... *G11C 16/3454* (2013.01); *G11C 29/44* (2013.01); *G11C 29/52* (2013.01); *G11C 29/76* (2013.01)

(58) Field of Classification Search
CPC .. G06F 11/1072; G06F 11/14; G06F 16/3436; G06F 16/3459; G11C 16/3426; G11C 16/3454; G11C 16/3459; G11C 29/44; G11C 29/52

See application file for complete search history.

(56) References Cited

U.S. PATENT DOCUMENTS

| 7,961,504 B2 * | 6/2011 | Kim | .................... G11C 11/5678 365/158 |
| 2010/0232227 A1 * | 9/2010 | Lee | ........................ G11C 16/10 365/185.19 |

FOREIGN PATENT DOCUMENTS

| KR | 1020100027787 | 3/2010 |
| KR | 1020130117555 | 10/2013 |

* cited by examiner

*Primary Examiner* — Shelly A Chase
(74) *Attorney, Agent, or Firm* — IP & T Group LLP

(57) ABSTRACT

A semiconductor memory device includes a memory cell array including a plurality of memory cells, a read and write circuit temporarily storing program data to be programmed into the memory cell array during a program operation, and reading data stored in the memory cell array and temporarily storing read data during a read operation, and a control logic detecting an error in the program operation by comparing the program data with the read data.

17 Claims, 6 Drawing Sheets

SEMICONDUCTOR MEMORY DEVICE, MEMORY SYSTEM INCLUDING THE SAME, AND OPERATING METHOD THEREOF

CROSS-REFERENCE TO RELATED APPLICATION

The present application claims priority to Korean patent application number 10-2015-0016257, filed on Feb. 2, 2015, the entire disclosure of which is herein incorporated by reference in its entirety.

BACKGROUND

Field of Invention

Various exemplary embodiments relate generally to an electronic device and, more particularly, to a semiconductor memory device, a memory system including the same, and an operating method thereof.

Description of Related Art

Semiconductor memory devices are typically categorized into volatile memory devices or non-volatile memory devices.

The non-volatile memory devices operate at relatively low write and read speeds, but they retain stored data even without power. Therefore, non-volatile memory devices may be used to store data which needs to be maintained regardless of power on/off conditions. Examples of non-volatile memory devices include Read Only Memory (ROM), Mask ROM (MROM), Programmable ROM (PROM), Erasable Programmable ROM (EPROM), Electrically Erasable Programmable ROM (EEPROM), flash memory, Phase-change Random Access Memory (PRAM), Magnetoresistive RAM (MRAM), Resistive RAM (RRAM) and Ferroelectric RAM (FRAM). Flash memories are categorized into NOR and NAND types.

Flash memories enjoy the advantages of both RAM and ROM. For example, flash memories may be freely programmed and erased similar to RAM. Similar to ROM, flash memories may retain stored data even when they are not powered. Flash memories have been widely used as the storage media of portable electronic devices such as mobile phones, digital cameras, Personal Digital Assistants (PDAs), and MP3 players.

SUMMARY

Various embodiments are directed to a semiconductor memory device capable of improving the reliability of a program operation by detecting an error during the program operation, a memory system including the same, and an operating method thereof.

A semiconductor memory device according to an embodiment may include a memory cell array including a plurality of memory cells, a read and write circuit temporarily storing program data to be programmed into the memory cell array during a program operation, and reading data stored in the memory cell array and temporarily storing read data during a read operation, and a control logic detecting an error in the program operation by comparing the program data with the read data.

A method of operating a semiconductor memory device according to an embodiment may include counting first data of program data inputted during a program operation to store a first counting number, programming first memory cells with the program data, reading data programmed into the first memory cells, counting first data of read data to store a second counting number, and detecting an error in the program operation by comparing the first counting number with the second counting number.

A memory system according to an embodiment may include a semiconductor memory device performing a program operation and a read operation on a plurality of memory cells, and a controller controlling the semiconductor memory device to perform the program operation in response to a program command when the program command is received from a host, wherein the controller detects an error in the program operation by comparing program data received during the program operation with read data received after the program operation is completed, from the semiconductor memory device.

DETAILED DESCRIPTION

Figure 1:
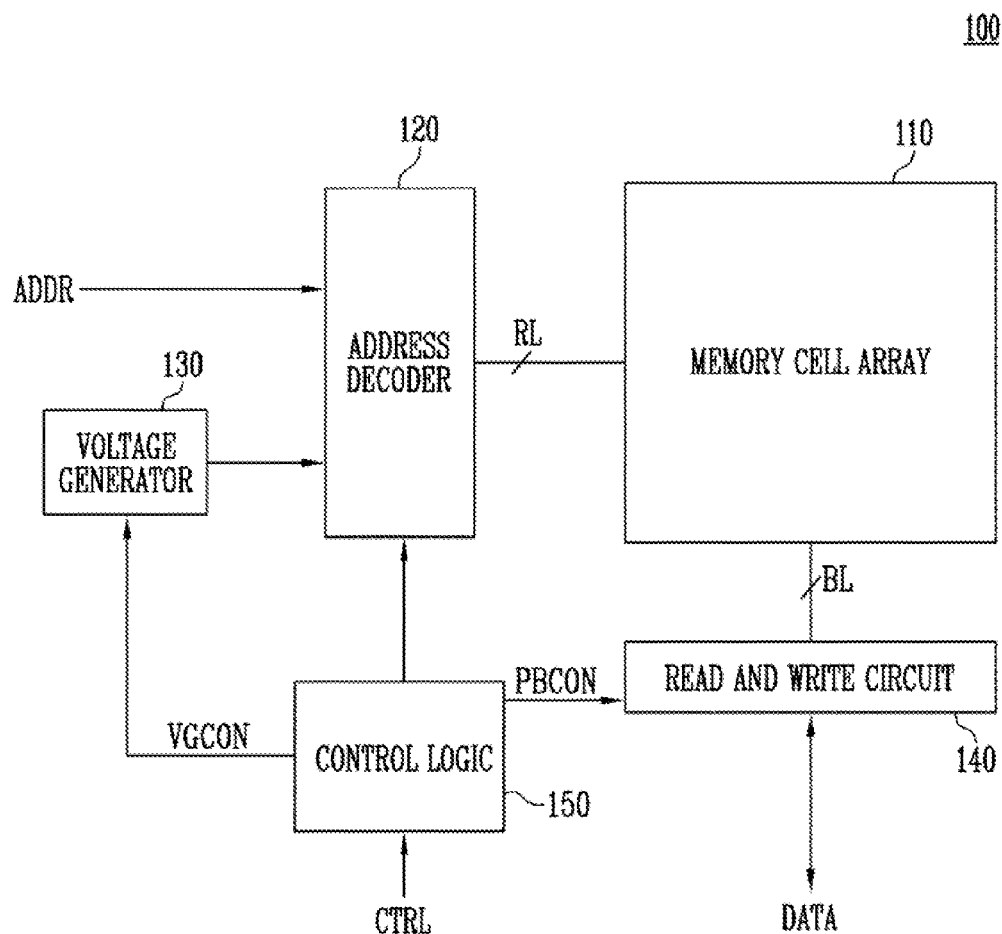
FIG. 1 is a block diagram illustrating a semiconductor memory device according to an embodiment.

Hereinafter, various exemplary embodiments will be described in detail with reference to the accompanying drawings. In the drawings, thicknesses and lengths of components may be exaggerated for convenience. A detailed explanation of related functions and constitutions may be omitted for simplicity and conciseness. Like reference numerals refer to like elements throughout the specification and drawings.

Furthermore, 'connected/coupled' represents that one component is directly coupled to another component or indirectly coupled to another component with intervening components therebetween. A singular form may include a plural form as long as it is not specifically mentioned. Furthermore, 'include/comprise' or 'including/comprising' used in the specification represents that one or more components, steps, operations, and elements exist or are added.

FIG. 1 is a block diagram illustrating a semiconductor memory device 100.

Referring to FIG. 1, a semiconductor memory device 100 may include a memory cell array 110, an address decoder 120, a voltage generator 130, a read and write circuit 140, and a control logic 150.

The memory cell array 110 may be coupled to the address decoder 120 through row lines RL. The memory cell array 110 may be coupled to the read and write circuit 140 through the bit lines BL.

The memory cell array 110 may include a plurality of memory blocks. Each of the plurality of memory blocks may include a plurality of cell strings. Each of the plurality of cell strings may include a plurality of memory cells which are stacked over a substrate. According to an embodiment, the plurality of memory cells may be non-volatile memory cells. According to an embodiment, each of the memory cells may be a single level cell or a multi level cell.

The address decoder 120, the voltage generator 130, and the read and write circuit 140 may operate as a peripheral circuit which drives the memory cell array 110.

The address decoder 120 may be coupled to the memory cell array 110 through the row lines RL. The row lines RL may include drain selection lines, word lines, source selection lines, and a common source line. According to an embodiment, the row lines RL may further include a pipe selection line.

The address decoder 120 may be configured to drive the row lines RL under control of the control logic 150. The address decoder 120 may receive an address ADDR from an external device or from an input/output buffer (not illustrated) in the semiconductor memory device 100.

A program operation of the semiconductor memory device 100 may be performed on the basis of memory blocks. In other words, a program operation may be performed on each selected memory block as a basic unit. Among the plurality of memory blocks, a program operation may be performed on a selected memory block, whereas other unselected memory blocks may operate in a program prohibition mode. The selected memory block may be set to one or more memory blocks.

During the program operation, a program voltage and a pass voltage for performing the program operation may be applied to word lines coupled to the selected memory block, and operating voltages for turning on source selection transistor and drain selection transistors may be applied to source selection lines and drain selection lines coupled to the selected memory block, respectively. In addition, during the program operation, word lines coupled to the unselected memory blocks may be controlled by a floating state. More specifically, some of the source selection lines and some of the drain selection lines which are coupled to the unselected memory blocks may be controlled by the floating state, and a ground voltage Vss may be applied to the remaining source selection lines and the remaining drain selection lines.

The address decoder 120 may include a block decoder, a row decoder, and an address buffer.

The voltage generator 130 may be configured to generate a plurality of voltages by using an external voltage supplied to the semiconductor memory device 100. The voltage generator 130 may operate under control of the control logic 150.

According to an embodiment, the voltage generator 130 may include a circuit which regulates the external voltage to generate a power voltage. For example, the voltage generator 130 may include a plurality of pumping capacitors and generate a plurality of voltages by selectively activating the plurality of pumping capacitors.

The read and write circuit 140 may be coupled to the memory cell array 110 through the bit lines BL. The read and write circuit 140 may operate under control of the control logic 150.

During a program operation, the read and write circuit 140 may temporarily store program data DATA which is inputted from the outside (e.g. from a host or external device), and apply a program permission voltage or a program inhibition voltage to the bit lines BL on the basis of the temporarily stored program data. DATA. In addition, the read and write circuit 140 may output information regarding the temporarily stored program data DATA to the control logic 150 during the program operation.

The read and write circuit 140 may read data programmed into the memory cells after the program operation is completed, and temporarily store read data to detect an error in the program operation. In addition, the read and write circuit 140 may output information regarding the temporarily stored read data to the control logic 150.

According to an exemplary embodiment, the read and write circuit 140 may include page buffers (or page registers) and a column selection circuit.

The control logic 150 may be coupled to the address decoder 120, the voltage generator 130, and the read and write circuit 140. The control logic 150 may receive a control signal CTRL from an external device or from the input/output buffer (not illustrated) of the semiconductor memory device 100. The control logic 150 may be configured to control the general operation of the semiconductor memory device 100 in response to the control signal CTRL.

During the program operation, the control logic 150 may control the peripheral circuit to perform the program operation by using an embedded algorithm in response to the control signal CTRL. The control logic 150 may control the peripheral circuit to detect an error in the program operation by using the information regarding the program data received from the read and write circuit 140 during the program operation and the information regarding the read data received from the read and write circuit 140 after the program operation is completed. When it is determined that an error is detected, the control logic 150 may control the peripheral circuit to program another page of the selected memory block or another memory block with the program data.

The semiconductor memory device 100 may further include an input/output buffer (not illustrated). The input/output buffer may externally receive the control signal CTRL and the address ADDR, and transfer the control signal CTRL and the address ADDR to the control logic 150 and the address decoder 120, respectively. In addition, the input/output buffer may be configured to transfer the external input program data DATA to the read and write circuit 140.

According to an exemplary embodiment, the semiconductor memory device 100 may be a flash memory device.

Figure 2:
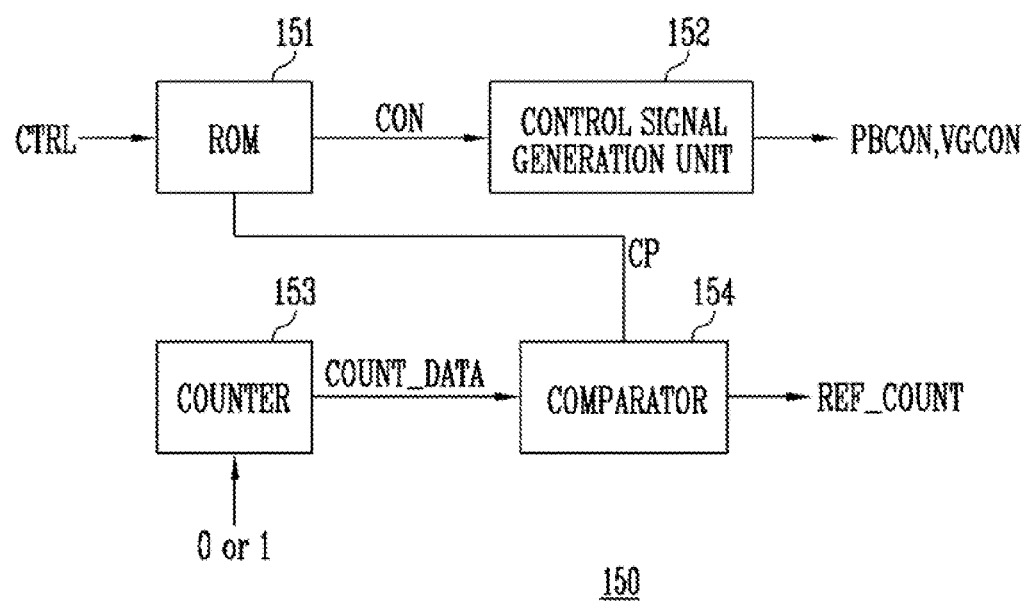
FIG. 2 is a block diagram illustrating a control logic shown in FIG.

FIG. 2 is a detailed block diagram illustrating the control logic 150 shown in FIG. 1.

Referring to FIG. 2, the control logic 150 may include a ROM 151, a control signal generation unit 152, a counter 153, and a comparator 154.

The ROM 151 may store an algorithm including information regarding the general operation of the semiconductor memory device 100. The ROM 151 may output an internal control signal CON according to the embedded algorithm in response to the control signal CTRL. In addition, the ROM 151 may output the internal control signal CON by detecting an error in the program operation in response to a comparison signal CP outputted from the comparator 154. When the error is detected, the ROM 151 may output the internal control signal CON so that the program operation may be performed on another page of the selected memory block or another selected memory block.

The control signal generation unit 152 may output a first control signal PBCON to control the read and write circuit 140 and a second control signal VGCON to control the voltage generator 130 in response to the internal control signal CON.

The counter 153 may count the number of 0 or 1 data (0 or 1) of the program data which is temporarily stored in the read and write circuit 140 during a program data input operation of the program operation to thereby output a count signal COUNT-DATA. During a read operation which is performed after the program operation is completed, the counter 153 may count the number of 0 or 1 data (0 or 1) of the read data which is temporarily stored in the read and write circuit 140 to thereby output the count signal COUNT-DATA.

The comparator 154 may compare the count signal COUNT-DATA for the program data with the count signal COUNT-DATA for the read data, and determine how many 0 or 1 data are added or subtracted to detect data variation. In addition, the comparator 154 may compare the detected variation with a predetermined number to output the comparison signal CP in response to a reference bit signal REF_COUNT. For example, when the data variation is greater than the predetermined number, it may be determined that there is an error in the program operation, and the comparator 154 may output the comparison signal CP corresponding thereto. When the data variation is less than or equal to the predetermined number, it may be determined that the program operation is properly performed, so that the comparator 154 may output the comparison signal CP corresponding thereto.

Figure 3:
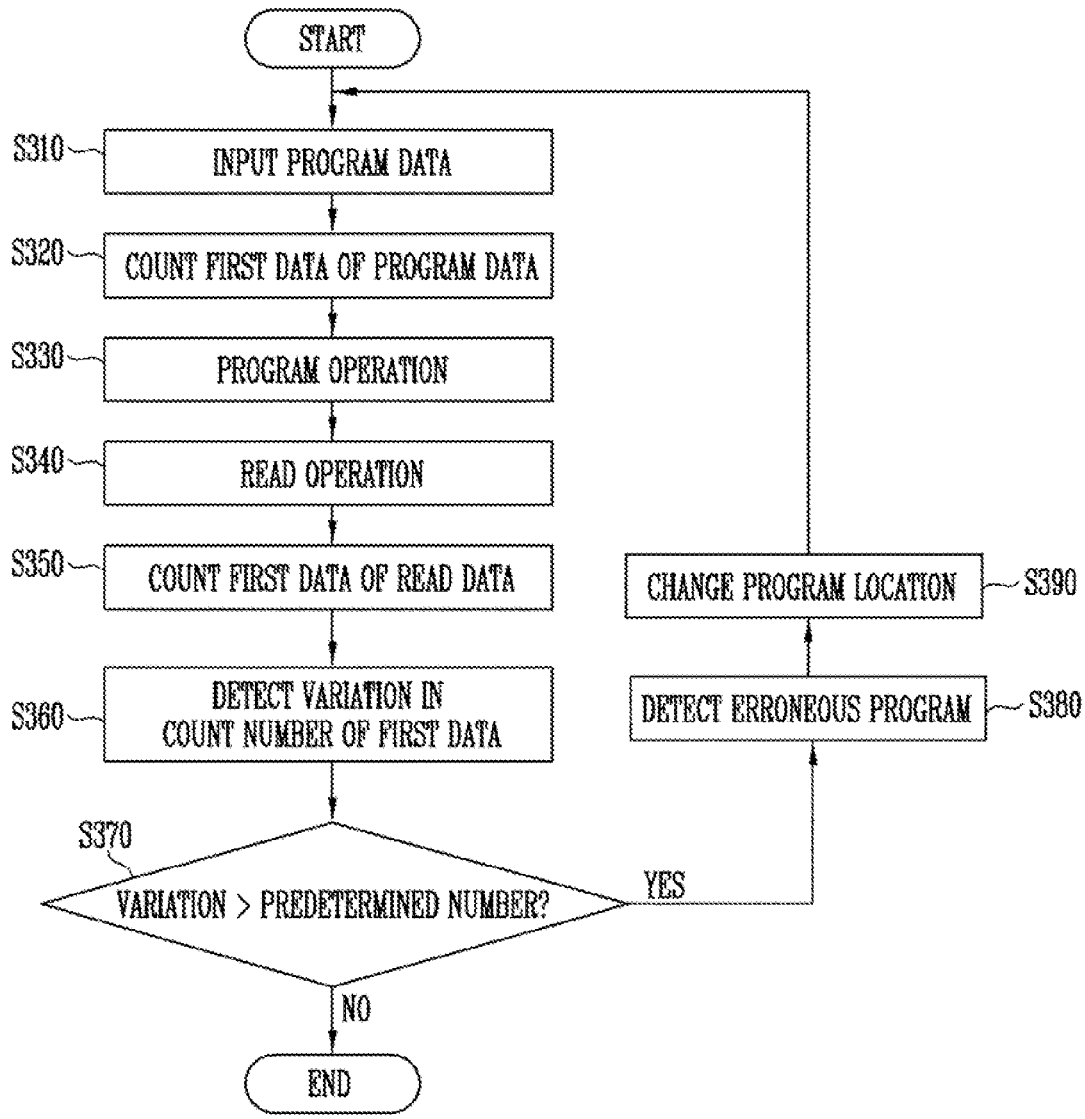
FIG. 3 is a flowchart illustrating operations of a semiconductor memory device according to an embodiment.

FIG. 3 is a flowchart illustrating a method of operating a semiconductor memory device according to an embodiment.

A method of operating a semiconductor memory device according to an embodiment is described below with reference to FIGS. 1 to 3.

1) Input Program Data (S310)

When the control signal CTRL for a program operation is inputted from an external device, the control logic 150 may control the read and write circuit 140 and temporarily store the program data DATA which are externally inputted.

2) Count First Data Program Data (S320)

The control logic 150 may count first data of the program data DATA temporarily stored in the read and write circuit 140, and temporarily store a count number. For example, the counter 153 of the control logic 150 may count the first data 0 or 1 of the temporarily stored program data DATA to output a count signal COUNT_DATA, and the comparator 154 may temporarily store count information corresponding to the count signal COUNT_DATA.

3) Program Operation (S330)

The control logic 150 may output the internal control signal CON for the program operation according to the algorithm stored in the ROM 151. The control signal generation unit 152 may output the first control signal PBCON and the second control signal VGCON in response to the internal control signal CON. The read and write circuit 140 may apply the program permission voltage or the program inhibition voltage to the bit lines BL on the basis of the program data DATA in response to the first control signal PBCON. In addition, the voltage generator 130 may generate a plurality of program operation voltages in response to the second control signal VGCON, and the address decoder 120 may apply the plurality of program operation voltages to the row lines RL of the memory cell array 110 to perform a program voltage applying operation under control of the control logic 150.

In addition, the control logic 150 may control the address decoder 120, the voltage generator 130, and the read and write circuit 140 to perform a program verify operation after the program voltage applying operation is completed.

4) Read Operation (S340)

When the above-described program operation (S330) is completed, program states of the memory cells may be read. The control logic 150 may output the internal control signal CON for a read operation according to the algorithm stored in the ROM 151. The control signal generation unit 152 may output the first control signal PBCON and the second control signal VGCON in response to the internal control signal CON. The voltage generator 130 may generate a plurality of read operation voltages in response to the second control signal VGCON. The address decoder 120 may apply the plurality of read operation voltages to the row lines RL of the memory cell array 110 under control of the control logic 150. In addition, the read and write circuit 140 may sense potentials of the bit lines BL, and sense and temporarily store read data in response to the second control signal PBCON.

The above-described read operation (S340) may be a program verify operation which is performed last in the overall program operation.

5) Count First Data of Read Data (S350)

The control logic 150 may count first data of the read data DATA temporarily stored in the read and write circuit 140 and temporarily store a count number. For example, the counter 153 of the control logic 150 may count first data 0 or 1 of the temporarily stored read data DATA and output the count signal COUNT_DATA, and the comparator 154 may temporarily store count information corresponding to the count signal COUNT_DATA.

6) Detect Variation in Count Number of First Data (S360)

The comparator 154 may compare the count information regarding the first data of the program data, which temporarily stored at step S320 where the first data of the above-described program data is counted, with the count information regarding the first data of the read data which is temporarily stored at step S350 where the first data of the above-described read data is counted, and detect a variation in the number of first data, i.e., an increase or a decrease in the number of first data.

7) Compare Variation with Predetermined Number (S370)

The comparator 154 may compare the detected variation with the predetermined number to output the comparison signal CP in response to the reference bit signal REF_COUNT. For example, when the variation is greater than the predetermined number, it may be determined that there is an error in the program operation, and the comparator 154 may output the comparison signal CP corresponding thereto. When the variation is less than or equal to the predetermined number, it may be determined that the program operation is properly performed, and the comparator 154 may output the comparison signal CP corresponding thereto.

8) Detect Erroneous Program (S380)

When the variation is greater than the predetermined number as a result of comparing the variation with the predetermined number at step S370, it may be determined that there is an error in the program operation.

9) Change Program Location (S390)

When it is determined that the program operation is erroneous, the control logic 150 may output the internal control signal CON to perform the program operation again according to an algorithm for the erroneous program operation which is stored in the ROM 151. The re-performed program operation may store program data at different places than the previous program operation. For example, the program operation may be re-performed by changing the selected memory block in the memory cell array 110 or changing the location of the selected page in the selected memory block.

As described above, according to an embodiment, after a program operation is completed, an error in the program operation may be detected by comparing program data with read data, and the program operation may be performed again by changing a program location when it is determined that there is an error in the program operation, so that reliability of the program operation may be improved.

Figure 4:
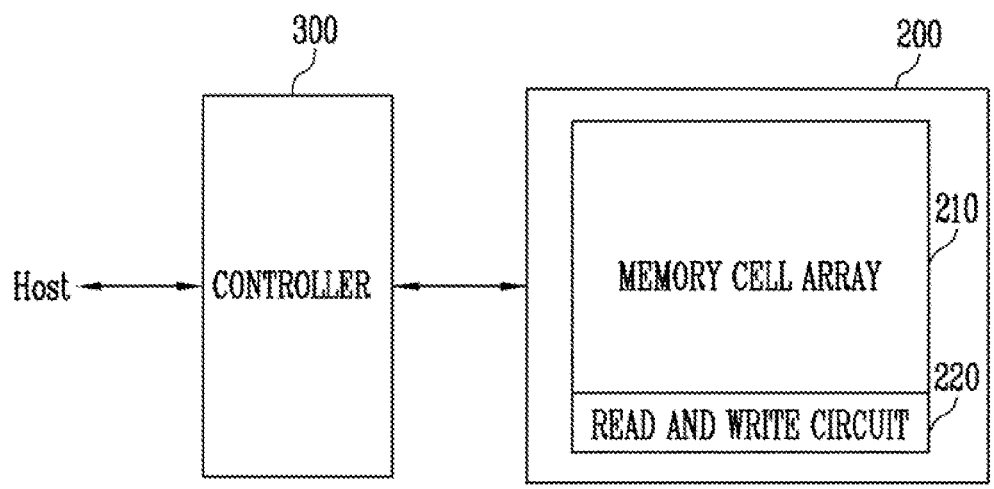
FIG. 4 is a block diagram illustrating a memory system including a semiconductor memory device according to another embodiment.

FIG. 4 is a block diagram illustrating a memory system including a semiconductor memory device according to another embodiment.

Referring to FIG. 4, a memory system may include a semiconductor memory device 200 and a controller 300. The semiconductor memory device 200 may include a memory cell array 210 and a read and write circuit 220 coupled to the memory cell array 210.

The memory cell array 210 may include a plurality of memory cells. Each of the memory cells may include multi-level memory cells that each store two or more data bits.

The semiconductor memory device 200 may operate under control of the controller 300. When receiving a program command from the controller 300, the semiconductor memory device 200 may be configured to perform a program operation on memory cells indicated by the address received with the program command, i.e., selected memory cells. The semiconductor memory device 200 may send information regarding first data of external input program data to the controller 300. In addition, the semiconductor memory device 200 may perform a read operation after the program operation is completed and may send information regarding first data of read data to the controller 300.

According to an embodiment, the semiconductor memory device 200 may be a flash memory device. However, the semiconductor memory device 200 of the present invention may not be limited to flash memory devices.

The controller 300 may be coupled between the semiconductor memory device 200 and a host. The controller 300 may be configured to interface the host and the semiconductor memory device 200. For example, at the request of the host, the controller 300 may translate a logical block address received from the host into a physical block address and provide the corresponding command and the physical block address to the semiconductor memory device 200 during a program operation. In addition, the controller 300 may receive the information regarding the first data of the program data from the semiconductor memory device 200 during the program operation, and the information regarding the first data of the read data from the semiconductor memory device 200 after the program operation is completed. The controller 300 may compare the information regarding the first data of the program data with the information regarding the first data of the read data to detect data variations, and compare the data variations with a predetermined number to detect errors in the program operation. When the error is detected in the program operation, the controller 300 may control the semiconductor memory device 200 to be re-programmed with the program data. The controller 300 may control the semiconductor memory device 200 to perform the program operation again by changing a program location.

The above-described controller 300 may be configured in substantially the same manner as the control logic 150 shown in FIG. 1.

As described above, according to another embodiment, a controller capable of detecting an error in a program operation may be provided between the host and the semiconductor memory device.

Figure 5:
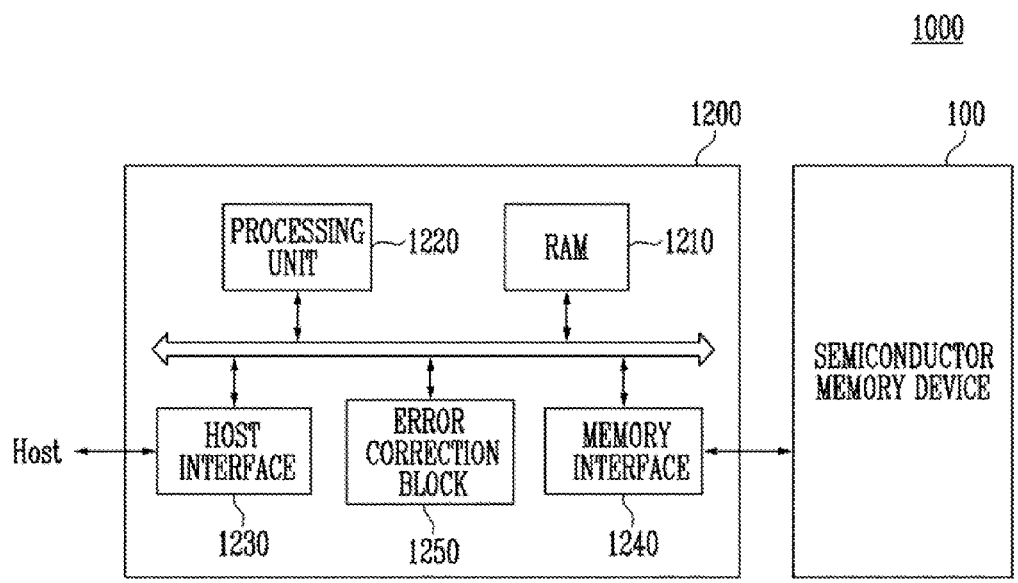
FIG. 5 is a block diagram illustrating a memory system including a semiconductor memory device according to FIG. 1.

FIG. 5 is a block diagram illustrating a memory system 1000 including the semiconductor memory device 100 shown in FIG. 1.

Referring to FIG. 5, the memory system 1000 may include the semiconductor memory device 100 and a controller 1200.

The semiconductor memory device 100 may be configured and operated in substantially the same manner as described above with reference to FIG. 1. Thus, a detailed description thereof will be omitted.

The controller 1200 may be coupled to a host and the semiconductor memory device 100. The controller 1200 may access the semiconductor memory device 100 at the request of the host. For example, the controller 1200 may control a read operation, a program operation, an erase operation, and/or a background operation of the semiconductor memory device 100. The controller 1200 may provide an interface between the semiconductor memory device 100 and the host. The controller 1200 may drive firmware for controlling the semiconductor memory device 100.

The controller 1200 may include a random access memory (RAM) 1210, a processing unit 1220, a host interface 1230, a memory interface 1240, and an error correction block 1250. The RAM 1210 may be used as operation memory of the processing unit 1220, a cache memory between the semiconductor memory device 100 and the host, and/or a buffer memory between the semiconductor memory device 100 and the host. The processing unit 1220 may control operations of the controller 1200.

The host interface 1230 may include a protocol for exchanging data between the host and the controller 1200. For example, the controller 1200 may communicate with the host through one or more protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, etc.

The memory interface 1240 may interface with the semiconductor memory device 100. For example, the memory interface 1240 may include a NAND flash interface or a NOR flash interface.

The error correction block 1250 may detect and correct errors in data read from the semiconductor memory device 100 by using an error correction code (ECC). The controller 1200 and the semiconductor memory device 100 may be integrated in a single semiconductor device. According to an embodiment the controller 1200 and the semiconductor memory device 100 may be integrated in a single semiconductor device to form a memory card such as a PC card (personal computer memory card international association (PCMCIA)), a compact flash card (CF), a smart media card (SMC), a memory stick, a multimedia card (MMC, RS-MMC or MMCmicro) an SD card (SD, miniSD, micro SD or SDHC), a universal flash storage device (UFS), etc.

The controller 1200 and the semiconductor memory device 100 may be integrated in a single semiconductor device to form a solid state drive (SSD). The SSD may include a storage device for storing data in a semiconductor memory device. When the memory system 1000 is used as an SSD, operational rates of the host coupled to the memory system 1000 may be significantly improved.

In another example, the memory system 1000 may be used as one of several elements in various electronic devices such as a computer, an ultra mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, etc.

According to an exemplary embodiment, the semiconductor memory device 100 or the memory system 1000 may be packaged in various forms. For example, the semiconductor memory device 100 or the memory system 1000 may be packaged by various methods such as a package on package (PoP), a ball grid array (BGA), a chip scale package (CSP), a plastic leaded chip carrier (PLCO), a plastic dual in line package (PDIP), a die in waffle pack, a die in wafer form, a chip on board (COB), a ceramic dual in line package (CERDIP), a plastic metric quad flat package (MQFP), a thin quad flat package (TQFP), a small outline integrated circuit (SOIL), a shrink small outline package (SSOP), a thin small outline package (TSOP), a system in package (SIP), a multi chip package (MCP), a wafer-level fabricated package (WFP), a wafer-level processed stack package (WSP), etc.

Figure 6:
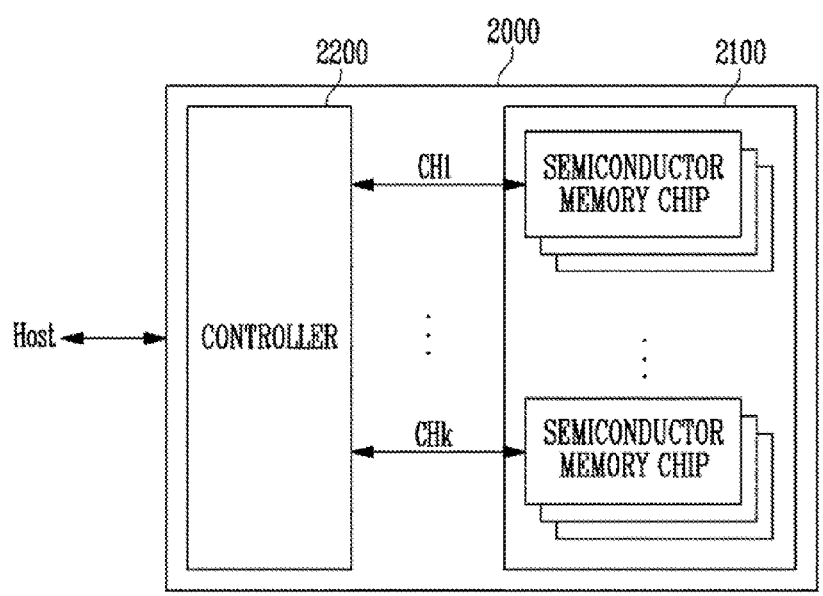
FIG. 6 is a block diagram illustrating an applied example of a memory system shown in FIG. 5.

FIG. 6 is a block diagram illustrating an applied example 2000 of the memory system 1000 shown in FIG. 5.

Referring to FIG. 6, a memory system 2000 may include a semiconductor memory device 2100 and a controller 2200. The semiconductor memory device 2100 may include semiconductor memory chips. The semiconductor memory chips may be divided into groups.

FIG. 6 illustrates the groups communicating with the controller 2200 through first to k-th channels CH1 to CHk, respectively. Each of the semiconductor memory chips may be configured and operated in substantially the same manner as the semiconductor memory device 100 described above with reference to FIG. 1.

Each group may communicate with the controller 2200 through a single common channel. The controller 2200 may be configured in substantially the same manner as the controller 1200 described with reference to FIG. 5, and configured to control the plurality of semiconductor memory chips of the semiconductor memory device 2100.

Figure 7:
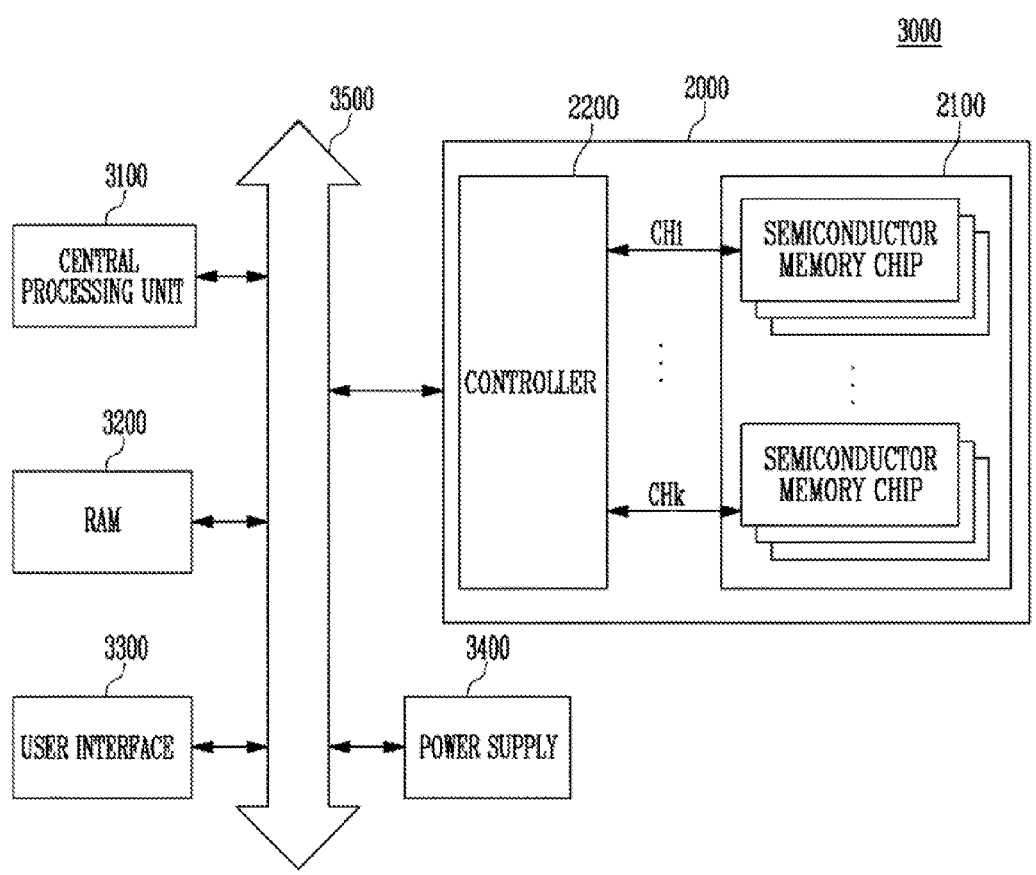
FIG. 7 is a block diagram illustrating a computing system including a memory system described with reference to FIG. 6.

FIG. 7 is a block diagram illustrating a computing system 3000 having the memory system 2000 described above with reference to FIG. 6.

Referring to FIG. 7, the computing system 3000 ray include a central processing unit 3100, a random access memory (RAM) 3200, a user interface 3300, a power supply 3400, a system bus 3500, and a memory system 2000.

The memory system 2000 may be electrically connected to the central processing unit 3100, the RAM 3200, the user interface 3300 and the power supply 3400 through the system bus 3500. Data provided through the user interface 3300 or processed by the central processing unit 3100 may be stored in the memory system 2000.

In FIG. 7, the semiconductor memory device 2100 may be coupled to the system bus 3500 through the controller 2200. However, the semiconductor memory device 2100 may be directly coupled to the system bus 3500. The central processing unit 3100 and the RAM 3200 may perform functions of the controller 2200.

As illustrated in FIG. 7, the computing system 3000 may include the memory system 2000 shown in FIG. 6. However, the memory system 2000 may be replaced with the memory system 1000 shown in FIG. 5. According to an embodiment, the computing system 3000 may include both of the memory systems 1000 and 2000 described above with reference to FIGS. 5 and 6.

According to another embodiment, during a program operation of a semiconductor memory device, program data and read data may be compared with each other. It may be determined that there is an error in the program operation when more data errors than a predetermined number occur, and the program operation may be performed on another memory page or another memory block, so that reliability of the program operation may be improved.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A semiconductor memory device, comprising:
   a memory cell array including a plurality of memory cells;
   a read and write circuit temporarily storing program data to be programmed into the memory cell array during a program operation, and reading data stored in the memory cell array and temporarily storing read data during a read operation; and
   a control logic detecting an error in the program operation by comparing the program data with the read data,
   wherein the control logic detects a data variation by comparing a number of first data bit of the program data to be programmed with a number of the first data bit of the read data, and detects the error in the program operation by comparing the data variation with a predetermined number.

2. The semiconductor memory device of claim 1, wherein the control logic controls the read and write circuit to perform the program operation and the read operation.

3. The semiconductor memory device of claim 2, wherein the control logic controls the read and write circuit to re-perform the program operation by changing a program location of the memory cell array when the error is detected in the program operation.

4. The semiconductor memory device of claim 1, wherein the control logic comprises:
   a read-only memory (ROM) suitable for storing an algorithm for the program operation and the read operation and outputting an internal control signal based on the algorithm;
   a control signal generation unit suitable for outputting a control signal to control the read and write circuit in response to the internal control signal;
   a counter suitable for counting the number of first data bit of the program data and the number of first data bit of the read data; and
   a comparator suitable for comparing the counted number of the first data bit of the program data with the counted number of the first data bit of the read data to detect a data variation, and comparing the data variation with a predetermined number to output a comparison signal,
   wherein the ROM outputs the internal control signal to perform a new program operation by detecting the error in the program operation in response to the comparison signal.

5. The semiconductor memory device of claim 1, further comprising:
   a voltage generator suitable for generating a plurality of program operation voltages during the program operation, and generating a plurality of read operation voltages during the read operation, in response to a control signal of the control logic; and an address decoder suitable for applying the plurality of program operation voltages or the plurality of read operation voltages to a row line of the memory cell array.

6. The semiconductor memory device of claim 1, wherein the first data bit is 0 or 1.

7. The semiconductor memory device of claim 1, wherein the read operation includes a program verify operation which is performed last in the program operation.

8. A method of operating a semiconductor memory device, the method comprising:
counting a number of first data bit of program data inputted during a program operation to store a first counting number;
programming first memory cells with the program data;
reading data programmed in the first memory cells;
counting a number of first data bit of the read data to store a second counting number; and
detecting an error in the program operation by comparing the first counting number with the second counting number.

9. The method of claim 8, wherein the programming of the first memory cells includes:
temporarily storing the program data in a read and write circuit; and
programming the first memory cells with the program data temporarily stored in the read and write circuit,
wherein the number of first data bit of the program data temporarily stored in the read and write circuit are counted and stored as the first counting number.

10. The method of claim 9, wherein the reading of the data includes:
temporarily storing the read data in the read and write circuit,
wherein the number of first data bit of the read data temporarily stored in the read and write circuit are counted and stored as the second counting number.

11. The method of claim 8, wherein the first data bit is 0 or 1.

12. The method of claim 8, wherein the reading of the data is a program verify operation which is performed last in the programming of the first memory cells with the program data.

13. The method of claim 8, wherein the detecting of the error in the program operation comprises:
detecting a data variation by comparing the first counting number with the second counting number; and
detecting the error in the program operation by comparing the data variation with a predetermined number.

14. The method of claim 8, further comprising:
re-programming the program data into second memory cells, which are different than the first memory cells, when the error is detected in the program operation.

15. A memory system, comprising:
a semiconductor memory device performing a program operation and a read operation on a plurality of memory cells; and
a controller controlling the semiconductor memory device to perform the program operation in response to a program command that is received from a host,
wherein the controller detects an error in the program operation by comparing program data received during the program operation with read data received after the program operation is completed, from the semiconductor memory device,
wherein the controller detects a data variation by comparing a number of first data bit of the program data with a number of the first data bit of the read data, and determines that the error exists in the program operation when the data variation is greater than a predetermined number.

16. The memory system of claim 15, wherein the semiconductor memory device comprises:
a memory cell array including the plurality of memory cells; and
a read and write circuit temporarily storing the program data and programming the memory cell array with the program data, or sensing the memory cell array programmed with the program data and temporarily storing the read data.

17. The memory system of claim 15, wherein the controller re-programs the semiconductor memory device with the program data when the error is detected in the program operation, wherein the semiconductor memory device re-performs the program operation by changing a program location.

* * * * *